United States Patent [19]

Chen et al.

[11] Patent Number: 5,272,714
[45] Date of Patent: Dec. 21, 1993

[54] DISTRIBUTED PHASE SHIFT SEMICONDUCTOR LASER

[75] Inventors: Gong Chen; Franco Cerrina, both of Madison, Wis.

[73] Assignee: Wisconsin Alumni Research Foundation, Madison, Wis.

[21] Appl. No.: 806,024

[22] Filed: Dec. 12, 1991

[51] Int. Cl.$^5$ .............................................. H01S 3/19
[52] U.S. Cl. ....................................... 372/96; 372/46
[58] Field of Search .................................. 372/96, 46

[56] References Cited

U.S. PATENT DOCUMENTS

| | | | |
|---|---|---|---|
| 4,726,031 | 2/1988 | Wakao et al. | 372/96 |
| 4,847,856 | 7/1989 | Sugimura et al. | 372/96 |
| 4,896,331 | 1/1990 | Hirata | 372/96 |
| 4,903,275 | 2/1990 | Ettenberg et al. | 372/50 |

FOREIGN PATENT DOCUMENTS

| | | | |
|---|---|---|---|
| 0178134 | 4/1986 | European Pat. Off. . | |
| 0224290 | 11/1985 | Japan | 372/43 |
| 61-14787 | 1/1986 | Japan | 372/96 |
| 62-188392 | 8/1987 | Japan | 372/43 |
| 63-0120888 | 6/1988 | Japan . | |
| 63-313890 | 12/1988 | Japan | 372/43 |
| 1-218088 | 11/1989 | Japan . | |
| 2-250384 | 10/1990 | Japan | 372/96 |
| 3229481 | 10/1992 | Japan . | |
| 2148595A | 5/1985 | United Kingdom . | |

OTHER PUBLICATIONS

Tada et al., Electronic Letters, vol. 20, No. 2, pp. 82–84 (Jan. 1984).
Matsuyama et al., IEEE Photonics Technology Letters, vol. 2, No. 9, pp. 612–613, (Sep. 1990).
Nakano et al., IEEE Jour. of Quantum Electronics, vol. 24, No. 10, pp. 2017–2033 (Oct., 1988).
Kotai et al., Electronics Letters, vol. 22, No. 9, pp. 462–463 (Apr. 1986).
Chen et al., (University of Wisconsin), Applied Physics Letters, vol. 60, No. 21, pp. 2586–2588 (May 25, 1992).
European Search Report (4 pages) in re EPA 9231093.7 dated Mar. 23, 1993.
Soda et al., "Stability in Single Logitudinal Mode Operation In GaInAsP/InP Phase-Adjusted DFB Lasers," IEEE J. of Quan. Elec., vol. QE-23, No. 6, 804 (Jun. 1987).
Lee, "Recent Advances in Long-Wavelength Semiconductor Lasers for Optical Fiber Communication", Proceedings of the IEEE, vol. 79, No. 3, 252 (Mar. 1991).
Kimura et al., "Coupled Phase-Shift Distributed-Feedback Semiconductor Lasers For Narrow Linewidth Operation," IEEE J. of Quan. Elect., vol. 25, No. 4, 678 (Apr. 1989).
Ogita et al., "Optimum Design for Multiple-Phase-Shift Distributed Feedback Laser", Electronics Letters, vol. 24, No. 12, 731 (Jun. 9th, 1988).
Glinski et al., "Yield Analysis of Second-Order DSM DSB Lasers and Implications For Design," IEEE J. of Quan. Elec., QE-23, No. 6, 849 (Jun. 1987).
Streifer et al., "Coupled Wave Analysis of DFB and DBR Lasers," IEEE J. of Quan. Elec. QE-13, No. 4, 134 (Apr. 1977).

*Primary Examiner*—James W. Davie
*Attorney, Agent, or Firm*—Olson & Hierl, Ltd.

[57] ABSTRACT

A laser using a distributed phase shift structure is disclosed. The active medium is formed in the shape of a stripe having first and second surfaces and two ends. The stripe includes a large central portion and two end portions with the central portion being of different widths than the two end portions. A laser device which utilizes the active medium of the present invention further includes at least one P-guide layer and at least one N-guide layer, both having a higher bandgap energy than the active medium. The P-guide layer and the N-guide layer are located on opposing surfaces of the active medium. A current which is injected through the N-guide layer, the P-guide layer and the active medium induces single mode, narrow linewidth coherent light to issue from the active medium.

26 Claims, 4 Drawing Sheets

DISTRIBUTED PHASE SHIFT SEMICONDUCTOR LASER

This invention was made with U.S. government support awarded by the National Science Foundation (NSF), Grant No. ECS-8921165. The U.S. Government has certain rights in this invention.

TECHNICAL FIELD

The disclosed device relates to semiconductor lasers and, in particular, to distributed phase shift semiconductor lasers.

BACKGROUND OF THE INVENTION

A semiconductor laser typically has a body of semiconductor material having a thin active medium between cladding regions of opposite conductivity type which form electrodes. To increase the output power, a guide layer having a refractive index which is intermediate the active and cladding layers may be interposed between one of the cladding regions and the active region. Light generated in the active medium propagates in both the active and guide layers thereby forming a beam at the emitting facet of the material. The cavity region comprising an active medium or the combination of a guide layer and an active medium restricts oscillation in the transverse direction, the direction perpendicular to the plane of the layers, to the fundamental optical modes.

However, such devices produced several frequencies of output or modes which is not preferred. To obtain a desired single-frequency oscillation, a frequency selective grating element can be integrated within the laser. In the distributed feedback (DFB) laser, the grating element is built in a waveguide layer adjacent to the active medium. In the conventional DFB semiconductor laser having a uniform diffraction grating, there are two longitudinal modes with equal threshold gain in principle on both sides of the Bragg wavelength. In practice, it is frequent that such DFB semiconductor lasers operate in double lasing modes, causing so-called mode-hopping noise. To overcome this defect and to effect the oscillation in a single longitudinal mode, DFB lasers with $\pi/2$ phase shifted grating structure have been made. To obtain a single-frequency laser, a $\pi/2$ phase shift can be incorporated into the grating element at the center of the laser cavity.

The physics which describes the lasing phenomena of the type described is well-known in the art and need not be further described here. An excellent discussion including the equations which generally describe semiconductor lasers is found in Lee, "Recent Advances in Long-Wavelength Semiconductor Lasers for Optical Fiber Communication," *Proceedings of the IEEE*, Vol. 79, No. 3, pgs. 253-276 (March 1991). This article is incorporated herein by reference.

Because most DFB lasers operate under a direct high frequency current modulation, a problem known as the spatial hole burning effect has to be considered. Spatial hole burning is a small localized active medium property change caused by localized mode pattern peaks. The local peaks result in a localized reduction of the number of occupied conduction-band states and empty valance-band states. Due to the finite mobility of the injected carrier in a semiconductor material, locally large optical fields that cause a locally large stimulated emission result in an uneven spatial carrier distribution. The uneven distribution changes the gain and refractive index profile of the active medium and causes a local Bragg frequency change. The spatial hole burning effect can destroy the single mode operation especially when the DFB laser is operated under a large current modulation.

The spatial hole burning effect also increases with the coupling strength kL of the DFB laser (k=coupling coefficient, L=total laser length). Modern optical communication systems require single mode, narrow spectral bandwidth lasers. Since the bandwidth is inversely proportional to the length of the laser, lengthening the laser narrows the bandwidth. However, the lengthening of a laser increases the coupling strength and hence the spatial hole burning effect. It has been found that spatial hole burning is the main effect which limits the possible length of a single mode DFB laser.

As an alternative to the use of a phase-shifted grating structure, a localized equivalent refractive index phase shift structure can be employed. The central shifting portion of the active medium generally has a different width than the end portions of the active medium and an equivalent phase shift thus can be achieved. However, due to the lack of understanding of the structure, the lasing condition was copied from a self-consistent oscillation used in a shifted grating structure. The length of the central portion was always chosen small in comparison with the total laser length. Thus, the central portion would be less than one-fifth or one-tenth of the total length of the active medium which concentrates the phase shift in a small area. As a result, such DFB lasers suffer a severe spatial hole burning effect especially when the coupling strength is over 3.

A discussion of the physics of the spatial hole burning effect including the mathematics describing such phenomena can be found in Kimura et al., "Coupled Phase-Shift Distributed-Feedback Semiconductor Lasers for Narrow Linewidth Operation," *IEEE Journal of Quantum Electronics*, Vol. 25, No. 4, pgs. 678-683 (April 1989). The cited article is incorporated herein by reference.

Therefore, what is needed is a DFB laser which can reduce the spatial hole burning effect while significantly maintaining a large gain margin for narrow linewidth, single mode operation. In addition, the structure should be designed to be larger than the pitch of feedback gratings and thus not put an extra requirement on lithography techniques used to fabricate these lasers.

The present invention meets these needs.

SUMMARY OF THE INVENTION

A laser apparatus using an active medium with three portions is disclosed. The active medium is generally in the shape of a stripe having first and second surfaces and output facets at the ends. The active medium includes a central portion and two end portions with the central portion being of a different width than the two end portions. The central portion is preferably wider than the end portions and about one-fifth to about four-fifths of the total length of the active medium. This distributes the phase shift in a large area and reduces the photon intensity in the central portion. The reduction in photon intensity then reduces the problems with spatial hole burning.

The semiconductive laser device utilizing the active medium preferably includes two electrodes adjacent the surfaces of the stripe. The electrodes are preferably at least one P-guide layer and at least one N-guide layer, both having a higher bandgap energy than the active medium. The P-guide layer and the N-guide layer are located on opposing surfaces of the stripe. The active medium, the P-guide layer and the N-guide layer are all semiconductive materials. A current which is injected through the N-guide layer, the P-guide layer and the active medium induces lasing from the active medium.

DETAILED DESCRIPTION OF THE PREFERRED EMBODIMENTS

Figure 1A:
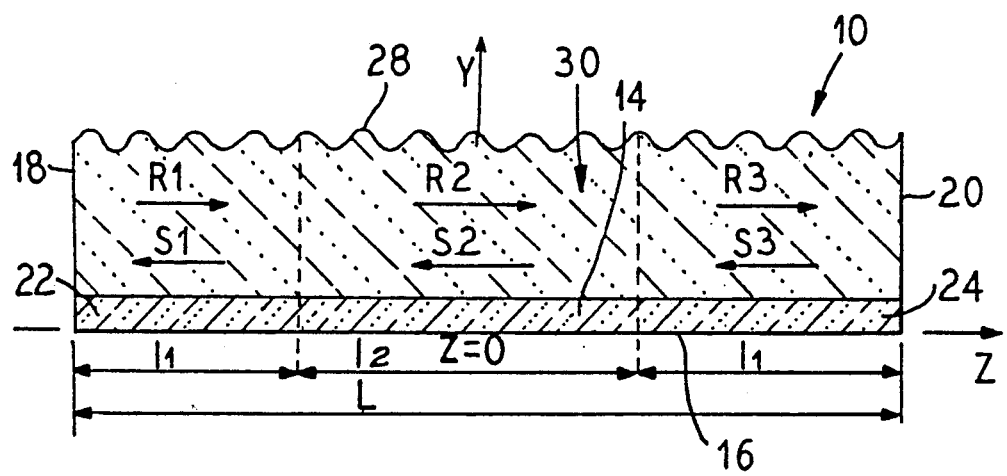
FIGS. 1A and 1B show the structure of an embodiment of a semiconductor laser device of the present invention.
Figure 1B:
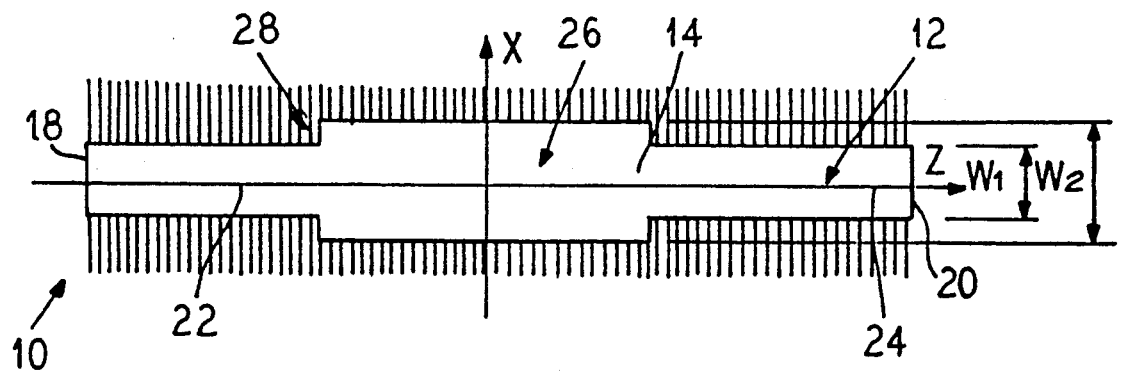
Figure 4:
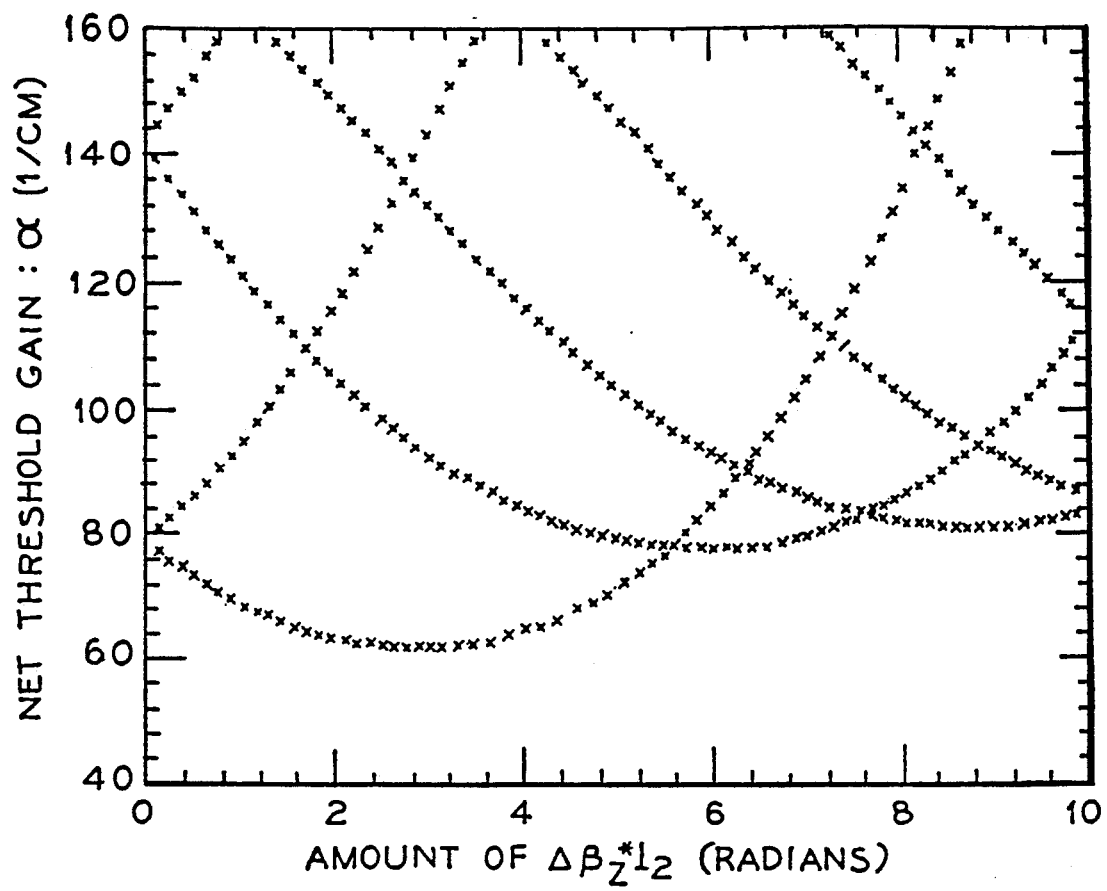
FIG. 4 shows the net threshold gain versus the amount of $d\beta_z l_2$ for the lowest gain oscillation modes in a device of the present invention, this device being a SAM DFB laser with $l_2/L=0.50$ and KL=2.

FIGS. 1A and 1B show the structure of a symmetric distributed phase shift DFB laser 10 of the present invention in a buried heterostructure semiconductor laser form. In the preferred embodiment shown, an active medium 12 is a semiconductor material in the form of a stripe with two surfaces 14 and 16 and two facet outputs at ends 18 and 20. At least one N-guide layer 30 and at least one P-guide layer 32 serve as electrodes to sandwich the active medium 12 to provide lasing action as best seen in FIG. 4. The N-guide layer 30 and the P-guide layer 32 have a higher bandgap energy than the active medium 12. Lasing action can also by produced by optical pumping if desired.

The active medium 12 has two end portions 22 and 24 with each end portion 22 and 24 preferably having a first length of $l_1$ and a first width of $w_1$. The active medium 12 of the laser 10 also includes a central portion 26 having a second length of $l_2$ and second width of $w_2$. Thus, the total laser length is $L = 2l_1 + l_2$.

The preferred embodiment described herein is a symmetric construction with the two end portion 22 and 24 being of equal length and width. However, asymmetric constructions having end portions 22 and 24 having differing widths and lengths are possible. However, different lengths generally lead to a degradation of performance. Differing widths are limited only by the fabrication techniques utilized and the desired performance characteristics.

The preferred embodiment includes a feedback grating element 28 which is continuous over either the N-guide layer 30 or the P-guide layer 32 and provides the same gain inside the laser 10. The laser 10 of the preferred embodiment has two facets at each end 18 and 20 with electric field reflection coefficients $p_1$ and $p_2$, respectively.

The grating element 28 creates a periodically varying index of refraction which couples two counter-propagating traveling waves. The grating element is preferably uniform, i.e. maintains the same grate spacing, along its length. Mode properties for DFB structures are analyzed by using coupled wave equations for the forward traveling wave $R(z)$ and the backward traveling wave $S(z)$ along the cavity.

The coupling is maximized for wavelengths close to the Bragg wavelength which is related to the period of the grating. In an idealized structure where there are no facet reflections, longitudinal modes are spaced symmetrically around the Bragg wavelength.

Because of the periodic index of refraction variation due to the grating element 28, there is a wavelength band known as the stop band within which the transmission through this periodic structure is zero and the reflection is the largest. Ordinarily, only the lowest order modes (m=0) are found within the stop band, and only oscillation on these two wavelengths can occur. Because of the symmetry in the structure, these two lowest order modes have the same threshold gain and lase simultaneously. A second order grating is somewhat preferred as it is easier to fabricate and certain loss factors can be manipulated to further support single mode operation. See J. Glinski and T. Makino, "Yield Analysis of Second-Order DSM DFB Lasers and Implications for Design," *IEEE J. of Quan. Elec.*, QE-23, No. 6, 849 (1987).

However, unlike a conventional phase-shifted DFB laser where the central portion 26 is always designed to be less than one-fifth or one-tenth of the total laser length, or where an abrupt grating shift structure is used as a phase shifter, the present device intentionally uses a larger central portion 26 to distribute the phase shift. Therefore, the light wave behavior inside the central portion 26 has to be considered.

In the device of the present invention, the central portion preferably has a length of between one-fifth and four-fifths of the total length of the active medium and more preferably is between one-third and two-thirds of the total length of active medium. The idea is to create a larger region in which the phase shifting takes place, thereby reducing the photon intensity in the center of the active medium which in turn substantially reduces the spatial hole burning effect. This reduction in photon intensity is discussed in more detail below.

In the DFB laser 10, the forward and backward propagating waves are governed by the coupled wave equations:

$$-dR(z)/dz + (\alpha/2 - j\delta)R(z) = jkS(z)$$
$$dS(z)/dz + (\alpha/2 - j\delta)S(z) = jkR(z)$$
$$\delta = \beta_z - \beta_0$$

where $\alpha$ is the net active medium gain, $\delta$ is mode detuning from the Bragg wavelength, j is a complex number and k is the coupling coefficient. In a DFB laser 10, $\delta$ determines the phase relation between the forward wave R and backward wave S. See, for example, W. Streifer, D. R. Scifres and R. D. Burnham, "Analysis of Grating-Coupled Radiation in GaAs:GaAlAs Lasers and Waveguides," *IEEE J. of Quan. Elec.*, QE-12, No. 7,422 (1976) and W. Streifer, D. R. Scifres and R. D. Burnham, "Coupled Wave Analysis of DFB and DBR Lasers," *IEEE J. of Quan. Elec.*, QE-13, No. 4, 134 (1977) incorporated by reference.

In the present device, the z-direction propagation constant of the light wave is $\beta_z$ in the two end portions 22 and 24. Because $w_2$ is designed to be slightly larger than $w_1$, the propagation constant is $\beta_z + d\beta_z$ in the central portion 26.

$d\beta_z$ is the difference between the propagation constant in the respective end portions 22 and 24 and the central portion 26. $d\beta_z$ is purposely designed to be much smaller than $\beta_z$ in order to keep the coupling coefficient k the same throughout the active medium 12 of the laser 10. The coupling strength kL is the coupling coefficient k multiplied by the total length L of the laser. The ratio of $d\beta_z/\beta_z$ is preferably less than 0.002. Therefore, in the present device, because of the z-direction propagation constant difference $d\beta_z$, the phase relation between R and S in the central portion 26 differs from that in the end portions 22 and 24.

To obtain the threshold gain conditions for different oscillation modes, the present device uses the general solutions of the coupled wave equations in each portion of the laser 10 and applies proper boundary conditions. The lasing condition requires non-trivial (non-zero) solutions of R and S in each section, which leads to the characteristic equation of the present device. Numerically solving this characteristic equation, a series of solution pairs are obtained: ($\alpha_i$, $\delta_i$; i=1, 2. . .). Each solution pair represents the necessary net threshold gain $\alpha_i$ and mode detuning $\delta_i$ for each oscillation mode.

In a distributed phase shift DFB laser 10, the boundary conditions are two facet reflection conditions and four electric field continuities at $z = -l_2/2$ and $z = +l_2/2$. Writing them out explicitly:

$R_1(-l_1 - l_2/2) = p_1 S_1(-l_1 - l_2/2);$ $S_3(l_1 + l_2/2) = p_2 R_3(l_1 + l_2/2)$ $R_1(-l_2/2) = R_2(-l_2/2); S_1(l_2/2) = S_2(-l_2/2)$ $R_2(l_2/2) = R_3(l_2/2); S_2(l_2/2) = S_3(l_2/2)$ where: $R_1$, $S_1$, $R_2$, $S_2$ and $R_3$, $S_3$ are the forward and backward waves in each portion as shown in FIG. 1A. $d\beta_z$ is included in the general solutions of $R_2$ and $S_2$. Knowing the lasing condition ($\alpha$, $\delta$) of a specific mode, we can calculate its photon intensity distribution I(z) inside the laser 10 as follows:

$I(z) = |R(z)|^2 + |S(z)|^2$

Figure 2:
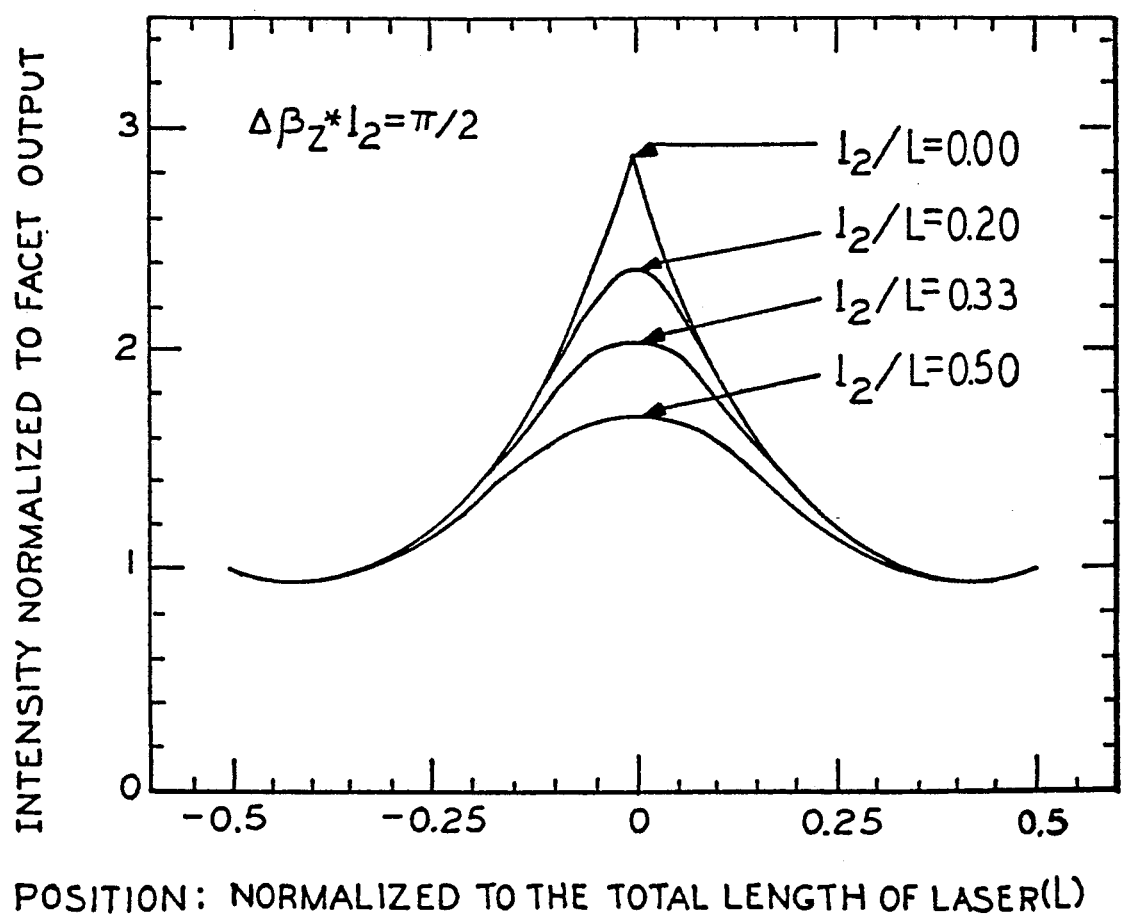
FIG. 2 shows a comparison of photon intensity distributions inside one type of device of the present invention, this device being a SAM DFB laser with KL=2.
Figure 3:
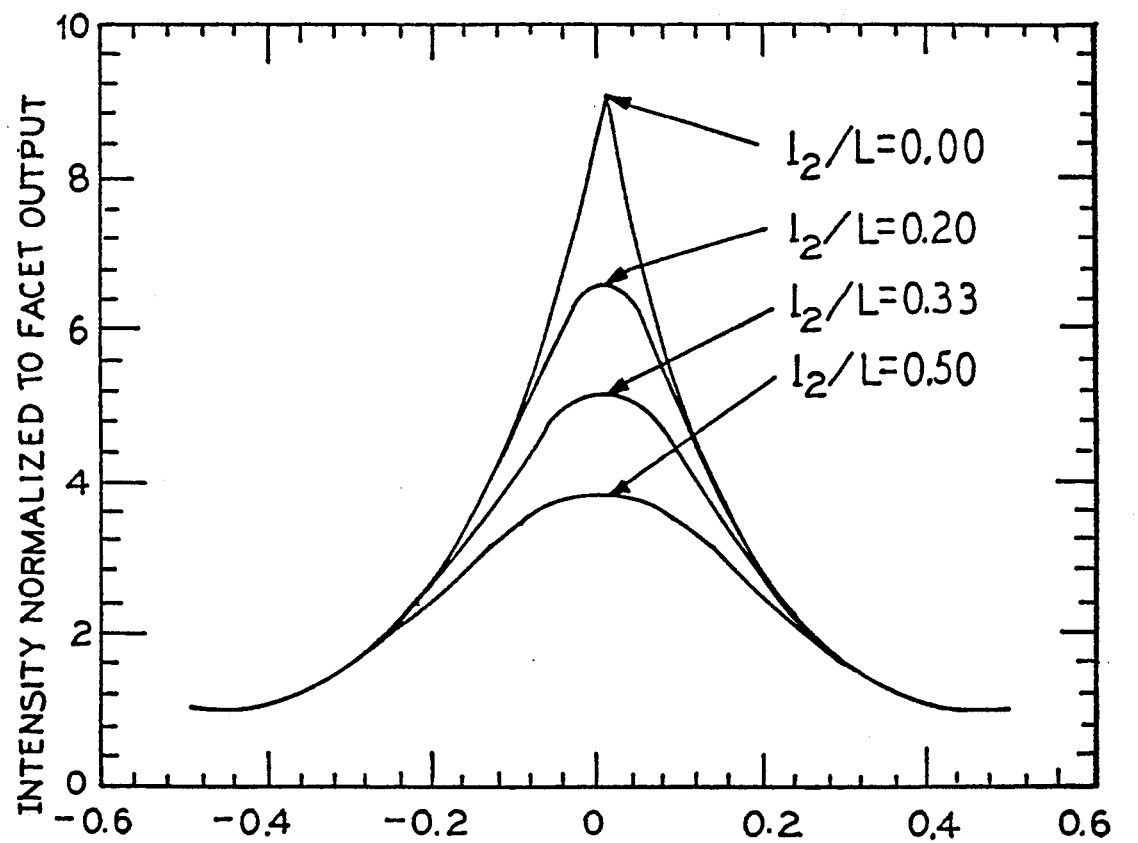
FIG. 3 shows a comparison of photon intensity distributions inside another type of device of the present invention having a larger coupling strength, this device being a SAM DFB laser with KL=3.

FIGS. 2 and 3 show the photon intensity distribution inside a distributed phase shift DFB laser 10 with coupling strengths of 2 and 3, respectively. The facet conditions of the laser 10 are $p_1 = p_2 = 0$ (no reflection) which can be achieved by an anti-reflection coating or a facet roughening. The vertical axis is the photon intensity normalized to the facet output; the horizontal axis is the position inside the laser 10 normalized to the total laser length L. Different curves present results for different shifted area length $l_2$ and it is indicated as $l_2/L$; the amount of $d\beta_z l_2$ is designed to $\pi/2$ in all cases.

FIG. 2 shows three graphs for various lengths $l_2$ of the central portion in an active medium having a coupling strength of 2. The curve for $l_2/L = 0$ represents a conventional phase-shifted DFB laser where the active medium has a uniform width along its length and a shifted grating structure is used. In such a phase-shifted DFB laser, he photon intensity distribution is highly non-uniform inside the laser and the intensity at the phase shifted position (z=0) is almost 3 times higher than that of the facet output. Therefore, severe spatial hole burning is expected to result. The photon intensity is still 2.5 times larger than the facet output if a localized equivalent refractive index phase shift structure having a central portion less than one-fifth of the total laser length is used.

FIG. 3 shows similar graphs for an active medium having a coupling strength of 3. Here, the photon intensity of Z=0 is more than nine times larger than the facet output for a shifted grating structure ($l_2/L=0$). It is clear that the larger the coupling strength kL, the more severe the spatial hole burning will be.

Spatial hole burning is a localized change in both the gain and the refractive index which is caused by a localized photon intensity peak and is the main limitation of a single mode operation and frequency modulation response of a phase-shifted DFB laser.

As discussed above, an important element of the present invention is to reduce the photon intensity in the center of the active medium thereby reducing spatial hole burning. As shown in FIGS. 2 and 3, photon intensity normalized with respect to the facet output for various ratios of the length of the central portion to the entire length of the active medium are shown. In FIG. 2, the photon intensity is shown for a laser having a coupling strength of 2, and in FIG. 3, the coupling strength is 3.

As can be seen, as the respective length of the central portion is increased, the photon intensity at the center has a lower ratio with respect to the intensity of the facet outputs. This reduction in photon intensity reduces the change in the index of refraction, and thus reduces the problems associated with spatial hole burning.

In the preferred embodiment, the ratio of the photon intensity at the center of the central portion compared to the photon intensity at the facet outputs is a factor of at least 1.5 less than the ratio of the photon intensity at the center of the central portion to the photon intensity at the facet outputs for a corresponding active medium where the central portions and the end portions have the same width and a shifted grating structure is used.

Referring to FIG. 2, the active medium of uniform width, $l_2/L=0.0$ has a ratio of 3, i.e. the intensity normalized to the facet outputs. The ratio for a central portion having a length of one-half of the total, $l_2/L=0.50$, is 1.7. This gives a reduction factor of 1.7.

A reduction factor of 2.3 for the coupling strength of 3 is shown in FIG. 3 when the central portion has a length of about one-half of that total. As can be seen, this preferred reduction in photon intensity is accomplished by using an active medium which has a central portion approximately one-half of the total length of the entire medium.

Thus, it is useful to look at the reduction in the photon intensity at the center using the distributed phase shift compared to a system which has either a medium of a uniform width along its length or a localized equivalent refractive index phase shift structure.

While FIGS. 2 and 3 show coupling strengths of 2 and 3, coupling strengths larger than 1.5 can be used. In particular, the mode pattern flatness of a DFB laser is smallest when the coupling strength is about 1.25. This also helps reduce the spatial hole burning effect.

Multiple phase-shifted DFB lasers have been proposed to reduce the spatial hole burning effect. Because of the small pitch size of a feedback grating element 28, a $\pi/4$ phase shift requires a 0.025 $\mu m$ shift of a first order feedback grating element 28 for a 1.4 $\mu m$ wavelength InGaAsP DFB laser. Moreover, the threshold gain difference between the lowest gain modes is sensitive to the amount of phase shift. Therefore, the fabrication of a multiple phase-shift grating poses a considerable challenge to electron beam lithography systems, which are currently being used to make feedback grating elements 28 for phase-shifted DFB lasers.

Further, the linewidth of a DFB laser is generally related to the laser length. The longer cavity laser with higher injection current can provide a narrow linewidth. Under these conditions, however, laser oscillation tends to be unstable due to the onset of a spurious higher order mode. An intrinsic mechanism for this instability is again the longitudinal spatial hole burning effect caused by the optical field intensity built up in the cavity.

At a small injection current, the carrier distribution along the longitudinal direction is uniform. However, when the injection current is large enough it will result in a spatially nonuniform refractive index which modifies the mode pattern.

The spatial carrier distribution causes a change of the refractive index which is linearly related to injected carrier density distribution. This change of the refractive index results in a distortion of the mode distribution and the coupled wave functions R(z) and S(z). With the increase of injection current, the lowest mode gain increases, while the gain for one of the next two higher order modes decreases. Since mode distortion increases with the cavity length, the hole burning effect becomes more serious when the cavity length is extended.

When the hole burning is strong enough, the gain for the lowest mode becomes larger than that for the next higher order mode at a specific injection current density. This defines the highest limit of injection current for single-mode operation. The achievable narrowest linewidth can be obtained for a given cavity length by using the calculated high limit for the injection current.

On the other hand, in the present device, this intensity non-uniformity is reduced significantly by increasing the length of the shifted area. When the length of the shifted area is half of the total laser length, $l_2/L=0.5$, the peak photon intensity is reduced to 1.6 times that of the facet output as shown in FIG. 2. Moreover, the intensity distribution also becomes much smoother. As a result, spatial hole burning is significantly reduced and the performance of the laser 10 is improved.

In one example, FIG. 4 shows the net threshold gain $\alpha$ versus $d\beta_z l_2$ for several lowest gain oscillation modes. The threshold gain difference of the lowest gain modes indicates the gain margin of a single mode operation. In this example, the distributed phase shift DFB laser 10 has $l_2/L=0.5$, coupling strength $kL=2$ and a total length of $L=250$ $\mu$m. Facet conditions are $p_1=p_2=0$. The vertical axis is the net threshold gain in units of $cm^{-1}$ and the horizontal axis is the amount of $d\beta_z l_2$ in radians. When $d\beta_z l_2=0$, corresponding to $w_1=w_2$, the two lowest gain oscillation modes have the same amount of threshold gain.

As $d\beta_z l_2$ increases as $w_2$ widens, the two lowest gain modes split out and different modes have different threshold gains. When $d\beta_z l_2$ is close to $\pi/2$, the threshold gain difference is more than 45 $cm^{-1}$ between the two lowest gain oscillation modes, and a single mode operation can be easily achieved.

For $d\beta_z l_2$ between $\pi/2$ to $\pi$, the gain margin is relatively insensitive to the change of $d\beta_z l_2$. This provides a large tolerance in fabricating the present device. In addition, it makes the present device relatively insensitive to spatial hole burning since the extra phase shift caused by spatial hole burning does not result in a large gain margin reduction.

As shown in FIG. 4, in the present device the gain margin does not vary periodically with $d\beta_z l_2$ and does not vanish when the total phase shift $2d\beta_z l_2=2\pi$. Thus, the central portion 26 does not act simply as a phase shifter. The selection of a large central portion 26 in the present device makes it principally different from a conventional phase-shifted DFB laser.

For a conventional grating shifted laser, having a total phase shift of $2\pi$ is equivalent to no phase shift at all, and the two modes have the same threshold gain.

Because the lowest loss for a silica-based fiber occurs at 1550 nm and the fiber dispersion vanishes around 1300 nm, the preferred choice for semiconductor materials used for a long distance, high bit rate optical communication system is InGaAsP, which emits photons with a spectrum range from 1300 nm to 1550 nm. The refractive index at this spectrum range is about 3.3. This determines the pitch P of a second order grating to be about 0.4 $\mu$m. The width of the groove for a second order grating is an important factor for the coupling coefficient and radiation loss. The largest amount of coupling coefficient is obtained when the width of the groove is about a quarter of the grating pitch P for a second order grating. Therefore, the groove width of the grating should be about 0.1 $\mu$m in order to obtain a large coupling coefficient k. Thus, a pitch of about 0.4 $\mu$m and groove of the grating of about 0.1 $\mu$m are preferred.

One method of manufacturing such a device is to use X-ray lithography combined with a biased mask; that is, to pre-design a mask which provides a required aerial image at a designed gap between mask and wafer. Mask biasing is known in the art and has also been employed in optical and electron beam lithography. A negative bias is preferred. For background information on fabrication techniques useful for DFB lasers see generally: G. M. Wells, B. Lai, D. So, R. Redaelli, F. Cerrina, "X-Ray Lithography Beamlines at Aladdin," *Nucl. Instru. Meth.*, A266, 278 (1988); E. E. Koch, *Handbook on Synchrotron Radiation*, North Holland, N.Y. (1983); J. Guo, G. Chen, V. White, P. Anderson and F. Cerrina, "Aerial Image Formation in Synchrotron-Radiation-Based X-Ray Lithography: The Whole Picture," *J. Vac. Sci. Tech.*, B 8, 1551 (1990); and B. Lai, F. Cerrina, "SHADOW: A Ray Tracing Program for Synchrotron Radiation," *Nucl. Instru. Meth.*, A246, 337 (1986).

Figure 5A:
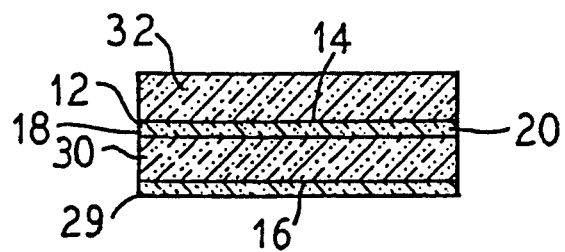
FIGS. 5A and 5B show steps in the process of manufacturing one embodiment of a device of the present invention.
Figure 5B:
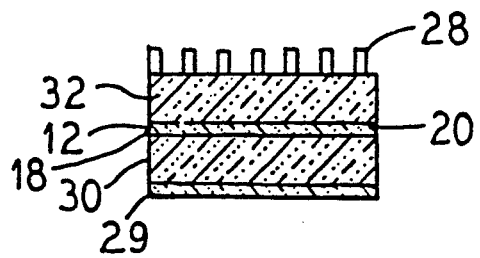

A method of manufacturing the present device is shown in FIGS. 5A and 5B. In this construction, the device is made to the following parameters:

$$L = 1000 \ \mu m$$
$$l_2 = 500 \ \mu m$$
$$l_2/L = 0.50$$
$$d\beta_z l_2 = \pi/2.$$

The long length of the laser 10 cavity in this example is possible because of the structure of the present device. As explained previously, such a long length in a DFB laser 10 would result in a severe spatial hole burning problem.

The process begins with an InP substrate 29 having a top and a bottom surface. The substrate 29, for example, is about 500 $\mu$m long, 20 $\mu$m wide and 50 $\mu$m thick. A N-guide layer 30 of InP ($\lambda_p=1.1$ $\mu$m) is epitaxially grown upon and covers the top of the substrate 29 to about 0.5 μm thick. The N-guide layer 30 has a bottom surface in contact with the top surface of the substrate 29 and an exposed top surface.

The active medium 12 is a stripe comprised of InGaAsP ($\lambda_p = 1.55$ μm) which is epitaxially grown upon the exposed top surface of the N-guide layer 30. The active medium 12 will have first width $w_1 = 3.0$ μm and a second width $w_2 = 3.5$ μm. Preferred Widths are between 2.5 μm and 5.0 μm with the ratio of $w_1/w_2$ between 0.80 and 0.95. These numbers will allow the device to meet the parameters disclosed above. The active medium 12 is about 0.3 μm thick. Being about 500 μm long, the ends 18 and 20 of the active medium 12 extend to the end of the substrate 29 and the subsequent N-guide layer 30.

A P-guide layer 32 of InP ($\lambda_p = 1.1$ μm) is also grown epitaxially upon the top of the active medium 12 and any exposed top surface of the N-guide layer 30. The P-guide layer 32 is about 0.8 μm thick over the N-guide layer 30 and about 0.5 μm over the active medium 12. The P-guide layer 32 and the N-guide layer 30 will enclose the active medium 12 stripe both laterally and vertically. The active medium 12 stripe will still be exposed at each end 18 and 20.

After the P-guide layer 32, a feedback grating element 28 having a pitch of about 0.24 μm for a first order grating or 0.48 μm for a second order grating is etched into the top surface of the P-guide layer 32 utilizing known electron beam techniques. Means for injecting a current comprising standard electrodes and insulators are then added. Lastly, two facets having $p_1 = p_2 = 0$ are added to each end 18 and 20 of the active medium.

This construction will result in a coherent beam of light having a wavelength of 1500 nm once a threshold current of 0.10 amperes is applied to the structure. The single mode laser 10 will show a photon intensity distribution similar to that seen in FIG. 3 for a coupling constant of $kL = 3.0$. As a result, spatial hole burning will be minimized and the laser 10 produces consistent results without spurious modes. The spectral bandwidth is less than 1 MHz.

The large central portion 26 structure can be employed in both buried heterostructure and rib-type waveguide structures. In a rib-type waveguide, the active medium is homogenous and optical fields are guided by a rib waveguide formed on the guide layer. A similar structure as shown in FIGS. 1A and 1B can be applied to the rib waveguide structure on the guided layer. The prior discussion is valid for a rib-type waveguide structure.

The $w_1$ and $w_2$ (see FIG. 1B) of the present device can be determined by the effective index of refraction method and the designed amount of $d\beta_z l_2$. Choosing a relatively large $w_1$ value, we can select $w_2 - w_1$ to be larger than the pitch of the feedback grating element 28. Therefore, the shifted active medium 12 structure does not pose extra requirements on electron beam lithography fabrication techniques.

Extensive study shows that for the present device having facets with reflection coefficients of $p_1 = p_2 = 0$, a large gain margin and small spatial hole burning can be achieved when the amount of shifted area length is between one-third to two-thirds of the total laser length and the amount of $d\beta_z l_2$ is between $\pi/3$ to $\pi$. Out of this range, the gain margin is small if the shifted area is too long, or the spatial hole burning is severe if the shifted area is to small.

The gain margin also becomes very small if $d\beta_z l_2 \geq 4$. For $p_1$ and $p_2$ not equal to zero, the threshold gain condition can also be calculated. Here, the gain margin will depend on the value and phases of $p_1$ and $p_2$. Since the pitch of the feedback grating element 28 is very small, the precise control of phases of $p_1$ and $p_2$ is very difficult. Therefore, $p_1 = p_2 = 0$ is usually desired to maintain a single mode operation in the present device.

A DFB laser with the disclosed structure results in a high performance single mode, narrow linewidth, easily manufactured operational semiconductor laser. The use of the disclosed structure results in a more uniform internal photon intensity distribution than that in a conventional phase-shifted DFB laser.

The disclosed structure for DFB lasers also results in a large gain margin for the single mode operation and this gain margin is relatively insensitive to the amount of extra phase shift caused by the spatial hole burning. As a result, spatial hole burning is not a problem and the performance of the laser can be greatly improved. Moreover, the disclosed device does not impose extra requirements on electron beam lithography machines for their fabrication.

The foregoing illustrates the general principles of this invention. However, since numerous modifications and changes will be readily apparent to those skilled in the art based on this description, it is not desired to limit the invention to the exact construction and operation shown and described.

What is claimed is:

1. A lasing apparatus comprising two electrodes, an active medium therebetween and a grating element between one of said electrodes and said active medium, said active medium comprising a semiconductor material including a central portion having a length and two end portions each having a length, said central portion being a different width than that of either of said two end portions, said length of said central portion being greater than about one-fifth of the combined lengths of said central portion and each of said end portions.

2. The lasing apparatus of claim 1 wherein said central portion is between about one-fifth and four-fifths of the total length of said active medium.

3. The lasing apparatus of claim 1 wherein said central portion is between about one-third and two-thirds of the total length of said active medium.

4. The lasing apparatus of claim 1 wherein said central portion is wider than said width of either of said two end portions.

5. The lasing apparatus of claim 1 wherein said two end portions are of equal length; and said active medium satisfies the following characteristic equations in each of said end portions:

$$-dR(z)/dz + (\alpha/2 - j\delta)R(z) = jkS(z)$$
$$dS(z)/dz + (\alpha/2 - j\delta)S(z) = jkR(z)$$
$$\delta = \beta_z - \beta_0$$

where
$R(z)$ is the forward traveling wave,
$S(z)$ is the backward traveling wave,
$\alpha$ is the net active medium gain,
$\delta$ is mode tuning from the Bragg wavelength,
$k$ is the coupling coefficient,
$j$ is a complex number,
$\beta_0$ is the Bragg wavelength and $\beta_z$ is the z-direction propagation constant, said characteristic equations having solution parts $(\alpha_i, \delta_i; i=1, 2...)$ which satisfy the following boundary conditions:

$$R_1(-l_1 - l_2/2) = p_1 S_1(-l_1 - l_2/2);$$

$$S_3(l_1 + l_2/2) = p_2 R_3(l_1 + l_2/2)$$

$$R_1(-l_2/2) = R_2(-l_2/2); S_1(l_2/2) = S_2(-l_2/2)$$

$$R_2(l_2/2) = R_3(l_2/2); S_2(l_2/2) = S_3(l_2/2)$$

where $l_1$ = length of each end portion,
$l_2$ = length of the central portion and
$z = 0$ and designates the center of said lasing apparatus.

6. The lasing apparatus of claim 5 wherein the value of the produce of said length of the central portion multiplied by the difference in the z-direction propagation constant between said central portion and said end portions is between $\pi/3$ and $\pi$.

7. The lasing apparatus of claim 1 which includes a grating element adjacent a surface of said active medium.

8. The lasing apparatus of claim 7 wherein said grating element is uniform.

9. The lasing apparatus of claim 1 wherein said electrodes each comprise at least one P-guide layer and at least one N-guide layer.

10. A lasing apparatus comprising two electrodes, an active medium located between said electrodes, and a grating element located between one of said electrodes and said active medium, said active medium having a length and opposed ends, and having a facet output at each end, said active medium comprising a semiconductor material including a central portion having a length and two end portions each having a length, said central portion having a different width from either of said two end portions, said length of said central portion being sufficiently large such that the ratio of photon intensity at the center of said central portion to the photon intensity at either of said facet outputs is a factor of at least about 1.5 less than the ratio of the photon intensity at said center of said central portion to the photon intensity at either of said facet outputs for a corresponding active medium where said central portion and said end portions each have the same width.

11. The lasing apparatus of claim 10 wherein said central portion is between about one-third and two-thirds of the total length of said active medium.

12. The lasing apparatus of claim 10 wherein said central portion is wider than either of said two end portions.

13. The lasing apparatus of claim 10 wherein the phase shift introduced by said central portion is about $\pi/2$.

14. The lasing apparatus of claim 10 which includes a uniform grating element adjacent a surface of said active medium.

15. A semiconductor laser device comprising:
a) two electrodes;
b) an active medium between said two electrodes and having first and second surfaces adjacent respective different ones of said electrodes, said active medium including a central portion between two end portions, the light propagation constant of said central portion being different from the light propagation constant of either of said end portions such that the phase shift caused by said central portion is about $\pi/2$, the length of said central portion being between about one-third and two-thirds of the total length of said active medium; and
c) a grating element adjacent one of said surfaces of said active medium.

16. The semiconductor laser device of claim 15 wherein said central portion is wider than either of said two end portions.

17. A semiconductor laser device comprising:
a) two electrodes;
b) an active medium between said two electrodes and having first and second surfaces adjacent different respective ones of said electrodes, said active medium including a central portion between two end portions each one of which has an output facet at its end, with said central portion being of greater width than either of said end portions, the light propagation constant of said central portion being larger than the light propagation constant of either of said end portions such that phase shift caused by said central portion is about $\pi/2$, and the ratio of the photon intensity at said center of said central portion to the photon intensity at said output facets is reduced by a factor of at least 1.5 compared to an active medium of uniform width; and
c) a uniform grating element adjacent one of said active medium surfaces.

18. The semiconductor laser device of claim 17 wherein said electrodes each comprise at least one P-guide layer and at least one N-guide layer.

19. The semiconductor laser device of claim 17 wherein said central portion is between about one-fifth and four-fifths of the total length of said active medium.

20. The semiconductor laser device of claim 17 wherein said central portion is between about one-third and two-thirds of the total length of said active medium.

21. A semiconductor laser device comprising:
(a) an active medium in the shape of a stripe, said stripe also having a first and a second surface and two ends, said stripe having a central portion and two end portions, said central portion being wider than either of said two end portions, said two end portions being of equal width, and the length of said central portion being between about one-fifth and four-fifths of the total length of said active medium;
(b) at least one P-guide layer having a higher bandgap energy than said active medium, said at least one P-guide layer being located on said first surface of said stripe;
(c) at least one N-guide layer having a higher bandgap energy than said active medium, said at least one N-guide layer being located on said second surface of said stripe;
(d) said active medium, said at least one P-guide layer and said at least one N-guide layer each being comprised of semiconductor materials;
(e) a grating element located on said at least one P-guide layer adjacent said first surface of said stripe; and
(f) means for injecting a current through said at least one N-guide layer, said at least one P-guide layer and said active, said injected current being sufficient to induce lasing form said active medium, said grating element providing optical feedback to said active medium and said central portion providing a phase shift whereby a single mode, narrow linewidth coherent light beam is emitted.

22. The laser device of claim 21 wherein said central portion is between about one-third and two-thirds of the total length of said active medium.

23. The laser device of claim 21 further comprising two facets on each of said two ends of said active medium, said facets having reflection coefficients $p_1$ and $p_2$, respectively.

24. The laser device of claim 23 wherein $p_1=_2=0$.

25. The laser device of claim 21 wherein said two end portions are of equal length; and said active medium satisfies the following characteristic equations:

$$-dR(z)/dz + (\alpha/2 - j\delta)R(z) = jkS(z)$$
$$dS(z)/dz + (\alpha/2 - j\delta)S(z) = jkR(z)$$
$$\delta = \beta_z - \beta_0$$

where
$R(z)$ is the forward traveling wave,
$S(z)$ is the backward traveling wave,
$\alpha$ is the net active medium gain,
$\delta$ is mode tuning from the Bragg wavelength,
$k$ is the coupling coefficient,
$j$ is a complex number,
$\beta_0$ is the Bragg wavelength and
$\beta_z$ is the z-direction propagation constant, said characteristic equations having solution pairs $(\alpha_i, \delta_i; i=1, 2...)$ which satisfy the following boundary conditions:

$$R_1(-l_1 - l_2/2) = p_1 S_1(-l_1 - l_2/2);$$
$$S_3(l_1 + l_2/2) = p_2 R_3(l_1 + l_2/2)$$
$$R_1(-l_2/2) = R_2(-l_2/2); S_1(l_2/2) = S_2(-l_2/2)$$
$$R_2(l_2/2) = R_3(l_2/2); S_2(l_2/2) = S_3(l_2/2)$$

where
$l_1$ = length of each end portion,
$l_2$ = length of the central portion and
$z=0$ and designates the center of said laser device.

26. The laser device of claim 25 wherein the value of the product of the length of said central portion multiplied by the difference in the z-direction propagation constant between said central portion and said end portions is between $\pi/3$ and $\pi$.

* * * * *

UNITED STATES PATENT AND TRADEMARK OFFICE
CERTIFICATE OF CORRECTION

PATENT NO. : 5,272,714
DATED : December 21, 1993
INVENTOR(S) : Gong Chen and Franco Cerrina It is certified that error appears in the above-indentified patent and that said Letters Patent is hereby corrected as shown below:

Column 1, line 32, change "hot" to --not--.

Column 3, line 16, change "KL=2" to --$\kappa L=2$--.

Column 3, line 20, change "KL=3" to --$\kappa L=3$--.

Column 3, line 24, change "KL=2" to --$\kappa L=2$--.

Column 5, line 63, change "he" to --the--.

Column 11, Claim 5, line 2, change "parts" to --pairs--.

Column 11, Claim 6, line 2, change "produce" to --product--.

Signed and Sealed this

Twenty-sixth Day of July, 1994

Attest:

BRUCE LEHMAN

*Attesting Officer*  *Commissioner of Patents and Trademarks*